(12) United States Patent  
Tong et al.

(10) Patent No.: US 9,217,544 B2  
(45) Date of Patent: Dec. 22, 2015

(54) LED BASED PEDESTAL-TYPE LIGHTING STRUCTURE

(71) Applicant: Cree, Inc., Durham, NC (US)

(72) Inventors: Tao Tong, Oxnard, CA (US); Ronan LeToquin, Freemont, CA (US); Bernd Keller, Santa Barbara, CA (US); Theodore Lowes, Lompoc, CA (US); Eric Tarsa, Goleta, CA (US); Mark Youmans, Goleta, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/014,272

(22) Filed: Aug. 29, 2013

(65) Prior Publication Data

US 2014/0003048 A1     Jan. 2, 2014

Related U.S. Application Data

(62) Division of application No. 12/848,825, filed on Aug. 2, 2010, now Pat. No. 8,562,161.

(60) Provisional application No. 61/339,516, filed on Mar. 3, 2010, provisional application No. 61/339,515, filed on Mar. 3, 2010.

(51) Int. Cl.  
*F21K 99/00* (2010.01)  
*F21V 3/00* (2015.01)  
(Continued)

(52) U.S. Cl.  
CPC ... *F21K 9/56* (2013.01); *F21K 9/00* (2013.01); *F21K 9/135* (2013.01); *F21V 3/00* (2013.01);  
(Continued)

(58) Field of Classification Search  
CPC .......... F21Y 2101/02; F21Y 2111/001; H01L 33/50; H01L 33/58; H01L 33/62; F21K 9/50; F21K 9/56  
USPC .............. 313/46, 498, 148, 512; 297/40, 269; 362/294, 365  
See application file for complete search history.

(56) References Cited

U.S. PATENT DOCUMENTS

| 2,394,992 A | 2/1946 | Franck ..................... 362/311.12 |
| 3,143,592 A | 8/1964 | August ....................... 174/16.3 |

(Continued)

FOREIGN PATENT DOCUMENTS

| CN | 1425117 | 6/2003 |
| CN | 1465106 A | 12/2003 |

(Continued)

OTHER PUBLICATIONS

First Office Action from Chinese Patent Appl. No. 201080062056.X, dated Feb, 12, 2014.

(Continued)

*Primary Examiner* — Tracie Y Green  
(74) *Attorney, Agent, or Firm* — Koppel, Patrick, Heybl & Philpott (57) ABSTRACT

LED based lamps and bulbs are disclosed that comprise a pedestal having a plurality of LEDs, wherein the pedestal at least partially comprises a thermally conductive material. A heat sink structure is included with the pedestal thermally coupled to the heat sink structure. A remote phosphor is arranged in relation to the LEDs so that at least some light from the LEDs passes through the remote phosphor and is converted to a different wavelength of light. Some lamp or bulb embodiments can emit a white light combination of light from the LEDs and the remote phosphor. These can include LEDs emitting blue light with the remote phosphor having a material that absorbs blue light and emits yellow or green light. A diffuser can be included to diffuse the emitting light into the desired pattern, such as omnidirectional.

31 Claims, 5 Drawing Sheets

(51) Int. Cl.
*F21V 3/04* (2006.01)
*F21Y 101/02* (2006.01)
*F21Y 111/00* (2006.01)
*F21V 29/77* (2015.01)

(52) U.S. Cl.
CPC .................. *F21V 3/04* (2013.01); *F21V 29/773* (2015.01); *F21Y 2101/02* (2013.01); *F21Y 2111/001* (2013.01); *F21Y 2111/007* (2013.01)

(56) References Cited

U.S. PATENT DOCUMENTS

| | | | | |
|---|---|---|---|---|
| 3,581,162 | A | 5/1971 | Wheatley | 317/234 |
| 4,204,246 | A | 5/1980 | Arii et al. | 361/699 |
| 4,727,289 | A | 2/1988 | Uchida | |
| 5,140,220 | A | 8/1992 | Hasegawa | |
| 5,463,280 | A | 10/1995 | Johnson | |
| 5,519,596 | A | 5/1996 | Woolverton | |
| 5,535,230 | A | 7/1996 | Abe | |
| 5,561,346 | A | 10/1996 | Byrne | 313/512 |
| 5,581,683 | A | 12/1996 | Bertignoll et al. | |
| 5,585,783 | A | 12/1996 | Hall | |
| 5,655,830 | A | 8/1997 | Ruskouski | |
| 5,688,042 | A | 11/1997 | Madadi | |
| 5,806,965 | A | 9/1998 | Deese | 362/249 |
| 5,838,101 | A | 11/1998 | Pappalardo | 313/487 |
| 5,850,126 | A | 12/1998 | Kanbar | |
| 5,890,794 | A | 4/1999 | Abtahi et al. | |
| 5,931,570 | A | 8/1999 | Yamuro | |
| 5,934,798 | A | 8/1999 | Roller et al. | 362/497 |
| 5,947,588 | A | 9/1999 | Huang | |
| 5,949,347 | A | 9/1999 | Wu | |
| 5,956,106 | A | 9/1999 | Petersen | |
| 5,959,316 | A | 9/1999 | Lowery | |
| 6,147,367 | A | 11/2000 | Yang et al. | 257/88 |
| 6,218,785 | B1 | 4/2001 | Incerti | 315/185 S |
| 6,220,722 | B1 | 4/2001 | Begemann | 362/231 |
| 6,220,731 | B1 | 4/2001 | Ryan | 362/373 |
| 6,227,679 | B1 | 5/2001 | Zhang et al. | |
| 6,234,648 | B1 | 5/2001 | Borner et al. | |
| 6,250,774 | B1 | 6/2001 | Begemann et al. | |
| 6,270,722 | B1 | 8/2001 | Yang et al. | 422/37 |
| 6,276,822 | B1 | 8/2001 | Bedrosian et al. | |
| 6,350,041 | B1 | 2/2002 | Tarsa et al. | |
| 6,404,131 | B1 | 6/2002 | Kawano et al. | 315/82 |
| 6,465,961 | B1 | 10/2002 | Cao | 315/58 |
| 6,517,221 | B1 | 2/2003 | Xie | 362/373 |
| 6,523,978 | B1 | 2/2003 | Huang | 362/252 |
| 6,550,953 | B1 | 4/2003 | Ichikawa et al. | |
| 6,634,770 | B2 | 10/2003 | Cao | 362/294 |
| 6,659,632 | B2 | 12/2003 | Chen | |
| 6,709,132 | B2 | 3/2004 | Ishibashi | |
| 6,746,885 | B2* | 6/2004 | Cao | 438/26 |
| 6,764,202 | B1 | 7/2004 | Herring et al. | 362/371 |
| 6,803,607 | B1 | 10/2004 | Chan et al. | |
| 6,848,819 | B1 | 2/2005 | Arndt et al. | |
| 6,860,620 | B2 | 3/2005 | Kuan et al. | 362/294 |
| 6,864,513 | B2 | 3/2005 | Lin et al. | |
| 6,910,794 | B2 | 6/2005 | Rice | 362/547 |
| 6,948,829 | B2 | 9/2005 | Verdes et al. | 362/227 |
| 6,982,518 | B2 | 1/2006 | Chou et al. | |
| 6,997,580 | B2 | 2/2006 | Wong | 362/311.02 |
| 7,048,412 | B2 | 5/2006 | Martin et al. | |
| 7,080,924 | B2 | 7/2006 | Tseng et al. | |
| 7,086,756 | B2 | 8/2006 | Maxik | |
| 7,086,767 | B2 | 8/2006 | Sidwell et al. | |
| 7,094,362 | B2 | 8/2006 | Setlur et al. | 252/301 |
| 7,140,753 | B2 | 11/2006 | Wang et al. | 362/294 |
| 7,144,135 | B2 | 12/2006 | Martin et al. | |
| 7,160,012 | B2 | 1/2007 | Hilscher et al. | |
| 7,160,120 | B2 | 1/2007 | Zhang et al. | |
| 7,165,866 | B2 | 1/2007 | Li | |
| 7,172,314 | B2 | 2/2007 | Currie et al. | |
| 7,213,940 | B1 | 5/2007 | Van De Ven | |
| D546,980 | S | 7/2007 | Lo | |
| 7,270,446 | B2 | 9/2007 | Chang et al. | 362/294 |
| D553,267 | S | 10/2007 | Yuen | |
| 7,350,936 | B2 | 4/2008 | Ducharme et al. | 362/231 |
| 7,354,174 | B1 | 4/2008 | Yan | |
| 7,377,674 | B2 | 5/2008 | Klinkman et al. | 362/484 |
| 7,396,142 | B2 | 7/2008 | Laizure, Jr. et al. | |
| 7,405,857 | B2 | 7/2008 | Ma et al. | |
| 7,413,325 | B2 | 8/2008 | Chen | 362/249.01 |
| D581,556 | S | 11/2008 | To et al. | D26/2 |
| 7,547,124 | B2 | 6/2009 | Chang et al. | 362/373 |
| 7,549,782 | B2 | 6/2009 | Ng et al. | 362/555 |
| 7,553,047 | B2 | 6/2009 | Shin et al. | 362/294 |
| 7,588,351 | B2 | 9/2009 | Meyer | 302/294 |
| 7,600,882 | B1 | 10/2009 | Morejon et al. | 362/84 |
| 7,607,802 | B2 | 10/2009 | Kang et al. | 362/294 |
| 7,614,759 | B2 | 11/2009 | Negley | |
| 7,618,157 | B1 | 11/2009 | Galvez | |
| 7,663,315 | B1 | 2/2010 | Hulse | |
| 7,686,478 | B1 | 3/2010 | Hulse | |
| 7,726,836 | B2 | 6/2010 | Chen | |
| 7,740,365 | B2 | 6/2010 | Huttner et al. | 362/97 |
| 7,753,568 | B2 | 7/2010 | Hu et al. | 362/373 |
| 7,810,954 | B2 | 10/2010 | Kolodin | 362/277 |
| 7,824,065 | B2 | 11/2010 | Maxik | |
| D629,928 | S | 12/2010 | Chen | |
| 7,884,538 | B2 | 2/2011 | Mitsuishi et al. | 313/502 |
| 7,976,335 | B2 | 7/2011 | Weber et al. | 439/487 |
| 7,989,236 | B2 | 8/2011 | Yamaguchi et al. | 438/26 |
| 8,021,025 | B2 | 9/2011 | Lee | |
| 8,235,571 | B2 | 8/2012 | Park | 362/555 |
| 8,253,316 | B2 | 8/2012 | Sun et al. | |
| 8,272,762 | B2 | 9/2012 | Maxik et al. | |
| 8,274,241 | B2 | 9/2012 | Guest et al. | 315/294 |
| 8,277,082 | B2 | 10/2012 | Dassanayake et al. | |
| 8,282,250 | B1 | 10/2012 | Dassanayake et al. | |
| 8,292,468 | B2 | 10/2012 | Narendran et al. | |
| 8,309,969 | B2 | 11/2012 | Suehiro et al. | 257/79 |
| 8,314,537 | B2 | 11/2012 | Gielen et al. | 313/46 |
| 8,322,896 | B2 | 12/2012 | Falicoff et al. | |
| 8,348,470 | B2 | 1/2013 | Liu et al. | 362/294 |
| 8,368,100 | B2 | 2/2013 | Donofrio et al. | |
| 8,371,722 | B2 | 2/2013 | Carroll | |
| 8,400,051 | B2 | 3/2013 | Hakata et al. | |
| 8,410,512 | B2 | 4/2013 | Andrews | 257/99 |
| 8,415,865 | B2 | 4/2013 | Liang et al. | |
| 8,421,320 | B2 | 4/2013 | Chuang | |
| 8,421,321 | B2 | 4/2013 | Chuang | |
| 8,421,322 | B2 | 4/2013 | Carroll et al. | |
| 8,449,154 | B2 | 5/2013 | Uemoto et al. | |
| 8,502,468 | B2 | 8/2013 | Li et al. | |
| 8,568,009 | B2 | 10/2013 | Chiang et al. | 362/563 |
| 8,641,237 | B2 | 2/2014 | Chuang | |
| 8,653,723 | B2 | 2/2014 | Cao et al. | |
| 8,696,168 | B2 | 4/2014 | Li et al. | |
| 8,740,415 | B2 | 6/2014 | Wheelock | |
| 8,750,671 | B1 | 6/2014 | Kelly et al. | |
| 8,752,984 | B2 | 6/2014 | Lenk et al. | |
| 8,760,042 | B2 | 6/2014 | Sakai et al. | |
| 8,922,106 | B2 | 12/2014 | Helbing et al. | 313/318.11 |
| 2002/0047516 | A1 | 4/2002 | Iwasa et al. | 313/512 |
| 2003/0021113 | A1 | 1/2003 | Begemann | |
| 2003/0038291 | A1 | 2/2003 | Cao | |
| 2003/0185005 | A1 | 10/2003 | Sommers et al. | |
| 2004/0021629 | A1 | 2/2004 | Sasuga et al. | |
| 2004/0159846 | A1 | 8/2004 | Doxsee | |
| 2004/0201990 | A1 | 10/2004 | Neyer | |
| 2004/0223315 | A1 | 11/2004 | Suehiro et al. | 362/84 |
| 2005/0068776 | A1 | 3/2005 | Ge | 362/296 |
| 2005/0168990 | A1 | 8/2005 | Nagata et al. | 362/294 |
| 2005/0174780 | A1 | 8/2005 | Park | 362/294 |
| 2005/0219060 | A1 | 10/2005 | Curran et al. | 340/815.45 |
| 2005/0225988 | A1 | 10/2005 | Chaves et al. | |
| 2005/0242711 | A1 | 11/2005 | Bloomfield | |
| 2005/0276053 | A1 | 12/2005 | Nortrup et al. | 362/294 |
| 2006/0097245 | A1 | 5/2006 | Aanegola et al. | 257/26 |
| 2006/0097385 | A1 | 5/2006 | Negley | 257/722 |
| 2006/0105482 | A1 | 5/2006 | Alferink et al. | 438/22 |
| 2006/0138435 | A1 | 6/2006 | Tarsa et al. | 257/89 |
| 2006/0152140 | A1 | 7/2006 | Brandes | 313/503 |

(56) References Cited

U.S. PATENT DOCUMENTS

| | | | |
|---|---|---|---|
| 2006/0152820 A1 | 7/2006 | Lien et al. | 359/726 |
| 2006/0180774 A1 | 8/2006 | Endo | 250/485.1 |
| 2006/0227558 A1 | 10/2006 | Osawa et al. | 362/351 |
| 2007/0047232 A1 | 3/2007 | Kim et al. | |
| 2007/0090737 A1 | 4/2007 | Hu et al. | 313/11 |
| 2007/0091633 A1 | 4/2007 | Harrity et al. | |
| 2007/0139938 A1 | 6/2007 | Petroski et al. | |
| 2007/0139949 A1 | 6/2007 | Tanda et al. | 362/551 |
| 2007/0158668 A1 | 7/2007 | Tarsa et al. | 257/98 |
| 2007/0206375 A1 | 9/2007 | Lys et al. | |
| 2007/0215890 A1 | 9/2007 | Harbers et al. | |
| 2007/0223219 A1 | 9/2007 | Medendorp | |
| 2007/0263405 A1 | 11/2007 | Ng et al. | 362/555 |
| 2007/0267976 A1 | 11/2007 | Bohler et al. | 315/112 |
| 2007/0274080 A1 | 11/2007 | Negley et al. | 362/341 |
| 2007/0285924 A1 | 12/2007 | Morris et al. | 362/264 |
| 2007/0297183 A1 | 12/2007 | Coushaine | |
| 2008/0037257 A1 | 2/2008 | Bolta | |
| 2008/0062694 A1 | 3/2008 | Lai et al. | 362/294 |
| 2008/0080165 A1 | 4/2008 | Kim | |
| 2008/0093615 A1 | 4/2008 | Lin et al. | |
| 2008/0106893 A1 | 5/2008 | Johnson et al. | |
| 2008/0117620 A1 | 5/2008 | Hama et al. | 362/84 |
| 2008/0128735 A1 | 6/2008 | Yoo | |
| 2008/0149166 A1 | 6/2008 | Beeson et al. | 136/248 |
| 2008/0173884 A1 | 7/2008 | Chitnis et al. | 257/98 |
| 2008/0179611 A1 | 7/2008 | Chitnis et al. | 257/98 |
| 2008/0232119 A1 | 9/2008 | Ribarich | 362/373 |
| 2008/0285279 A1 | 11/2008 | Ng et al. | 362/249 |
| 2008/0308825 A1 | 12/2008 | Chakraborty et al. | 257/98 |
| 2009/0001399 A1 | 1/2009 | Diana et al. | 257/98 |
| 2009/0015137 A1 | 1/2009 | Su et al. | 313/503 |
| 2009/0040760 A1 | 2/2009 | Chen et al. | 362/249 |
| 2009/0046473 A1 | 2/2009 | Tsai et al. | 362/373 |
| 2009/0058256 A1 | 3/2009 | Mitsuishi et al. | 313/487 |
| 2009/0059559 A1 | 3/2009 | Pabst | |
| 2009/0067180 A1 | 3/2009 | Tahmosybayat | 362/339 |
| 2009/0086492 A1 | 4/2009 | Meyer | |
| 2009/0095960 A1 | 4/2009 | Murayama | 257/79 |
| 2009/0101930 A1 | 4/2009 | Li | |
| 2009/0103293 A1 | 4/2009 | Harbers et al. | 362/231 |
| 2009/0103296 A1 | 4/2009 | Harbers et al. | |
| 2009/0116217 A1 | 5/2009 | Teng et al. | |
| 2009/0161356 A1 | 6/2009 | Negley et al. | 362/231 |
| 2009/0175041 A1 | 7/2009 | Yuen et al. | |
| 2009/0184618 A1 | 7/2009 | Hakata et al. | |
| 2009/0190353 A1 | 7/2009 | Barker | 362/249 |
| 2009/0195186 A1 | 8/2009 | Guest et al. | 315/294 |
| 2009/0201679 A1 | 8/2009 | Konaka | 362/235 |
| 2009/0213595 A1 | 8/2009 | Alexander et al. | 362/373 |
| 2009/0217970 A1 | 9/2009 | Zimmerman et al. | 136/252 |
| 2009/0262516 A1 | 10/2009 | Li | 362/84 |
| 2009/0273727 A1 | 11/2009 | Kubota et al. | 349/62 |
| 2009/0273924 A1 | 11/2009 | Chiang | 362/241 |
| 2009/0283779 A1 | 11/2009 | Negley et al. | 257/88 |
| 2009/0296387 A1 | 12/2009 | Reisenauer et al. | 362/235 |
| 2009/0310368 A1 | 12/2009 | Incerti et al. | 362/326 |
| 2009/0316073 A1 | 12/2009 | Chen et al. | 349/64 |
| 2009/0316383 A1 | 12/2009 | Son | |
| 2009/0322197 A1 | 12/2009 | Helbing | |
| 2009/0322208 A1 | 12/2009 | Shaikevitch et al. | 313/503 |
| 2009/0322800 A1 | 12/2009 | Atkins | 345/690 |
| 2009/0323333 A1 | 12/2009 | Chang | |
| 2010/0014839 A1 | 1/2010 | Benoy et al. | 386/117 |
| 2010/0020547 A1 | 1/2010 | Olsson | 362/311 |
| 2010/0025700 A1 | 2/2010 | Jung et al. | 257/89 |
| 2010/0026185 A1 | 2/2010 | Betsuda et al. | 315/32 |
| 2010/0027258 A1 | 2/2010 | Maxik et al. | 362/240 |
| 2010/0038660 A1 | 2/2010 | Shuja | 257/98 |
| 2010/0046231 A1 | 2/2010 | Medinis | 362/294 |
| 2010/0060144 A1 | 3/2010 | Justel et al. | 313/503 |
| 2010/0091487 A1 | 4/2010 | Shin | 362/235 |
| 2010/0096967 A1 | 4/2010 | Marinus et al. | 313/46 |
| 2010/0102707 A1 | 4/2010 | Fukuda et al. | 313/503 |
| 2010/0134047 A1 | 6/2010 | Hasnain | |
| 2010/0140655 A1 | 6/2010 | Shi | 257/99 |
| 2010/0149783 A1 | 6/2010 | Takenaka et al. | 362/84 |
| 2010/0149814 A1 | 6/2010 | Zhai et al. | 257/88 |
| 2010/0155763 A1 | 6/2010 | Donofrio et al. | |
| 2010/0170075 A1 | 7/2010 | Kanade et al. | 29/428 |
| 2010/0177522 A1 | 7/2010 | Lee | 362/373 |
| 2010/0201284 A1 | 8/2010 | Kraus | |
| 2010/0207502 A1 | 8/2010 | Cao et al. | 313/46 |
| 2010/0219735 A1 | 9/2010 | Sakai et al. | 313/46 |
| 2010/0232134 A1 | 9/2010 | Tran | 362/84 |
| 2010/0244729 A1 | 9/2010 | Chen et al. | 315/291 |
| 2010/0246165 A1 | 9/2010 | Diaz et al. | 362/183 |
| 2010/0264799 A1* | 10/2010 | Liu et al. | 313/46 |
| 2010/0314985 A1 | 12/2010 | Premysler | 313/46 |
| 2010/0327745 A1 | 12/2010 | Dassanayake et al. | |
| 2010/0328925 A1 | 12/2010 | Hoelen et al. | 362/84 |
| 2011/0001151 A1 | 1/2011 | Le Toquin | |
| 2011/0037368 A1 | 2/2011 | Huang | 313/46 |
| 2011/0044022 A1 | 2/2011 | Ko et al. | 362/84 |
| 2011/0058379 A1 | 3/2011 | Diamantidis | 362/296.01 |
| 2011/0074271 A1 | 3/2011 | Takeshi et al. | 313/46 |
| 2011/0074296 A1 | 3/2011 | Shen et al. | 315/112 |
| 2011/0080096 A1 | 4/2011 | Dudik et al. | 315/112 |
| 2011/0080740 A1 | 4/2011 | Allen et al. | 362/294 |
| 2011/0089804 A1 | 4/2011 | Mahalingam et al. | 313/46 |
| 2011/0089830 A1 | 4/2011 | Pickard et al. | 315/32 |
| 2011/0095686 A1 | 4/2011 | Falicoff et al. | 315/35 |
| 2011/0133222 A1 | 6/2011 | Allen et al. | 257/88 |
| 2011/0175528 A1 | 7/2011 | Rains et al. | 315/51 |
| 2011/0176316 A1 | 7/2011 | Phipps et al. | |
| 2011/0205733 A1 | 8/2011 | Lenderink et al. | 362/231 |
| 2011/0215696 A1 | 9/2011 | Tong et al. | 313/46 |
| 2011/0215699 A1 | 9/2011 | Le et al. | |
| 2011/0216523 A1 | 9/2011 | Tong et al. | 362/84 |
| 2011/0242816 A1 | 10/2011 | Chowdhury et al. | 362/294 |
| 2011/0267835 A1 | 11/2011 | Boonekamp et al. | 362/555 |
| 2011/0273072 A1 | 11/2011 | Oki | 313/46 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van de Ven et al. | 315/35 |
| 2012/0320591 A1 | 12/2012 | Liao et al. | 362/249 |
| 2013/0049018 A1 | 2/2013 | Ramer et al. | 257/61 |
| 2013/0063945 A1 | 3/2013 | Wu et al. | 362/249 |
| 2013/0119280 A1 | 5/2013 | Fuchi et al. | 250/504 R |
| 2013/0249374 A1 | 9/2013 | Le et al. | 313/12 |
| 2013/0293098 A1 | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1802533 | 7/2006 |
| CN | 1802533 | 12/2006 |
| CN | 101128695 | 2/2008 |
| CN | 101262032 | 9/2008 |
| CN | 1013388887 A | 1/2009 |
| CN | 101641623 | 2/2010 |
| CN | 102077011 | 2/2011 |
| CN | 102077011 | 5/2011 |
| DE | 4311937 A1 | 10/1994 |
| DE | 10251955 A1 | 5/2004 |
| DE | 102004051382 | 4/2006 |
| DE | 102006061164 | 6/2008 |
| DE | 10 2007 037 862 A1 | 10/2008 |
| DE | 202008013667 | 12/2008 |
| DE | 102011004718 | 8/2012 |
| EP | 0876085 | 11/1998 |
| EP | 0876085 A2 | 11/1998 |
| EP | 0890059 A1 | 1/1999 |
| EP | 0936682 A1 | 8/1999 |
| EP | 1058221 A2 | 12/2000 |
| EP | 1881259 | 1/2008 |
| EP | 2146135 A2 | 1/2010 |
| EP | 2154420 | 2/2010 |
| EP | 2469154 | 6/2012 |
| FR | 2941346 | 7/2010 |
| GB | 1423011 | 1/1976 |

(56) References Cited

FOREIGN PATENT DOCUMENTS

| | | |
|---|---|---|
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | H06283006 | 10/1994 |
| JP | H09265807 | 10/1997 |
| JP | H11177149 | 7/1999 |
| JP | 11-213730 A | 8/1999 |
| JP | H11260125 | 9/1999 |
| JP | 2000022222 | 1/2000 |
| JP | 2000173304 | 6/2000 |
| JP | 2001118403 | 4/2001 |
| JP | 2002525814 | 8/2002 |
| JP | 2003515899 | 5/2003 |
| JP | 2004146225 | 5/2004 |
| JP | 2004241318 | 8/2004 |
| JP | 2005-093097 A | 4/2005 |
| JP | 2005108700 | 4/2005 |
| JP | 20051008700 | 4/2005 |
| JP | 2005244226 | 9/2005 |
| JP | 2005-286267 A | 10/2005 |
| JP | 2005277127 | 10/2005 |
| JP | 2005021635 | 11/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | 200640850 A | 9/2006 |
| JP | 2006525648 | 11/2006 |
| JP | 2006331683 | 12/2006 |
| JP | 2007049019 | 2/2007 |
| JP | 200759930 | 3/2007 |
| JP | 2007059911 | 3/2007 |
| JP | 2007081090 | 3/2007 |
| JP | 2007184330 | 7/2007 |
| JP | 3138653 | 12/2007 |
| JP | 2008505448 | 2/2008 |
| JP | 2008508742 | 3/2008 |
| JP | 2008091140 | 4/2008 |
| JP | 2008108835 | 5/2008 |
| JP | 2008187195 | 8/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009059896 | 3/2009 |
| JP | 2009117346 | 5/2009 |
| JP | WO 2009093163 | 7/2009 |
| JP | U3153766 | 8/2009 |
| JP | WO 2009119038 | 10/2009 |
| JP | 2009266780 | 11/2009 |
| JP | 2009277586 | 11/2009 |
| JP | 2009295299 | 12/2009 |
| JP | WO2009148543 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | 100944181 | 2/2010 |
| KR | 1020100037353 | 4/2010 |
| KR | 100980588 B1 | 9/2010 |
| KR | 3020110008445 | 3/2011 |
| TW | 200505054 | 2/2005 |
| TW | 200527664 | 8/2005 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| TW | 200507686 | 9/2015 |
| WO | WO 00/17569 A1 | 3/2000 |
| WO | WO0124583 A1 | 4/2001 |
| WO | WO 01/40702 A1 | 6/2001 |
| WO | WO0160119 A2 | 8/2001 |
| WO | 2004068599 | 8/2004 |
| WO | 2004100213 | 11/2004 |
| WO | WO 2004100213 A2 | 11/2004 |
| WO | WO2004107213 | 11/2004 |
| WO | WO2005107420 A2 | 11/2005 |
| WO | 2006012043 | 2/2006 |
| WO | WO 2006059535 A2 | 6/2006 |
| WO | WO2006065558 | 6/2006 |
| WO | WO 2007/130358 A2 | 11/2007 |
| WO | WO 2007146566 A2 | 12/2007 |
| WO | WO 2008/018002 A2 | 2/2008 |
| WO | WO 2008018002 | 2/2008 |
| WO | WO2008018002 | 2/2008 |
| WO | WO 2008/052318 A1 | 5/2008 |
| WO | WO 2008/117211 A1 | 10/2008 |
| WO | WO 2008134056 A1 | 11/2008 |
| WO | WO 2008/146229 A2 | 12/2008 |
| WO | WO2008146229 | 12/2008 |
| WO | WO 2009/024952 A2 | 2/2009 |
| WO | WO2009052099 | 4/2009 |
| WO | 2009093163 | 7/2009 |
| WO | WO 2009/091562 A2 | 7/2009 |
| WO | WO 2009/093163 A2 | 7/2009 |
| WO | WO 2009091562 | 7/2009 |
| WO | WO 2009093163 | 7/2009 |
| WO | WO2009093163 | 7/2009 |
| WO | WO2009093163 A2 | 7/2009 |
| WO | WO 2009/107052 A1 | 9/2009 |
| WO | WO2009107052 | 9/2009 |
| WO | WO 2009/119038 A2 | 10/2009 |
| WO | WO 2009/128004 A1 | 10/2009 |
| WO | WO 2009119038 | 10/2009 |
| WO | WO2009119038 | 10/2009 |
| WO | WO2009125314 A2 | 10/2009 |
| WO | WO2009131627 | 10/2009 |
| WO | WO2009143047 A2 | 11/2009 |
| WO | WO 2009/158422 A1 | 12/2009 |
| WO | WO 2009158422 | 12/2009 |
| WO | WO2009158422 A1 | 12/2009 |
| WO | WO 2010/012999 A2 | 2/2010 |
| WO | WO2010012999 | 2/2010 |
| WO | WO 2010 012999 | 2/2010 |
| WO | WO2010013893 | 2/2010 |
| WO | WO 2010 052640 | 5/2010 |
| WO | WO 2010/119618 A1 | 10/2010 |
| WO | WO 2010/128419 A1 | 11/2010 |
| WO | WO2011100193 | 8/2011 |
| WO | WO 2011109098 | 9/2011 |
| WO | WO2012011279 | 1/2012 |
| WO | WO2012031533 | 3/2012 |

OTHER PUBLICATIONS

Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Office Action from Japanese Patent appl. No. 2012-556063, dated Jan. 28. 2014.
Comments on the Written Opinion and Amendment of the Application from European Patent appl. No. 12740244.4, dated Feb 20, 2014.

(56) References Cited

OTHER PUBLICATIONS

International Search Report and Written Opinion from PCT/US2013/057712 dated Feb. 4, 2014.
Office Action from U.S. Appl. No. 11/149,999, dated Jan. 15, 2014.
Office Action from U.S. Appl. No. 13/034,501, dated Jan. 23, 2014.
First Office Action from Chinese Patent Appl. No. 201180020709.2, dated May 4, 2014.
First Office Action from Chinese Patent Application No. 2011800207069, dated May 5, 2014.
First Office Action from Chinese Patent Application No. 201180022606, dated May 4, 2014.
Office Action from U.S. Appl. No. 13/028,946, dated May 27, 2014.
Office Action from U.S. Appl. No. 13/028,913, dated May 22, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
First Office Action and Search Report from Chinese Patent Appl No. 201180022620X, dated Jul. 1, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
Office Action from U.S. Appl. No. 13/029,068, dated Jun. 13, 2314.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No. 2012-556065, dated Aug. 5, 2014.
Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from U.S. Appl. No. 13/028,913, dated Nov. 4, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Notice of Reasons for Rejection from Japanese Patent Appl. No. 2012-543086, dated Aug. 27, 2013.
Office Action from U.S. Appl. No. 13/028,946, dated Jul. 16, 2012.
Response to OA from U.S. Appl. No. 13/028,946, filed Oct. 8, 2012.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 12/901,405, dated Jul. 1, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013.
Response to OA from U.S. Appl. No. 13/029,005, filed Apr. 17, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,946, filed Apr. 11, 2013.
Office Action from U.S. Appl. No. 13/028,913, dated Apr. 29, 2013.
Office Action from U.S. Appl. No. 13/029,005, dated Jan. 4, 2013.
Office Action from U.S. Appl. No. 12/848,825, dated Nov. 5, 2012.
Response to OA from U.S. Appl. No. 12/848,825, filed Feb. 5, 2013.
Office Action from U.S. Appl. No. 13/029,005, dated Jun. 11, 2013.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389. dated May 8, 2013.
International Preliminary Report on Patentability from PCT/US2011/000390, dated May 8, 2013.
Reasons for Rejection from Japanese Patent Appl. No. 2011-198454, dated Mar. 7, 2013.
WhiteOptics™ White97 Film, Reflector Film Technical Data Sheet from WhiteOptics, LLC, New Castel, DE.
WhiteOptics™ Metal, Technical Data Sheet from WhiteOptics, LLC, New Castel, DE.
U.S. Appl. No. 13/649,052, Lowes, et al, Oct. 10, 2012.
U.S. Appl. No. 13/649,067, Lowes, et al, Oct. 10, 2012.
U.S. Appl. No. 12/757,179, filed Apr. 9, 2010. Yuan, et al.
U.S. Appl. No. 12/901,405, filed Oct. 8, 2010, Tong.
U.S. Appl. No. 61/339,515, filed Mar. 3, 2010, Tong.
U.S. Appl. No. 12/975,820, Van De Ven.
U.S. Appl. No. 13/029,063, filed Feb. 16, 2011, Hussell.
U.S. Appl. No. 13/358,901, filed Jan. 26, 2012. Progl, et al.
U.S. Appl. No. 13/018,245, filed Jan. 31, 2011. Tong.
U.S. Appl. No. 12/848,825, filed Aug. 2, 2010. Tong.
U.S. Appl. No. 13/017,778, filed Jan. 31, 2011. Andrews.
U.S. Appl. No. 61/435,759, filed Jan. 24, 2011 Le.
U.S. Appl. No. 61/339,516, filed Mar. 3, 2010 Tong.
U.S. Appl. No. 61/424,670, filed Dec. 19, 2010, Zongjie Yuan.
Cree, Xlamp® LEDS, Product Info and Data Sheets. 34 Pages.
Nichia Corp Part Spec. *High Brightness LEDS*, (May 1999), 15 pgs. Ea. (NSPW 300BS, NSPW 312BS, Etc).
U.S. Appl. No. 13/022,490, Feb. 7, 2011. Tong.
U.S. Appl. No. 13/358,901, Jan. 26, 2012. Progl. et al.
Energy Star® Program Requirements for Integral LED Lamps, amended Mar. 22, 2010.
U.S. Appl. No. 12/757,179, filed Apr. 9, 2010, Yuan, et al.
U.S. Appl. No. 13/358,901, filed Jan. 26, 2012, Progl, et al.
International Search Report and Written Opinion for PCT Application No. PCT/US2010/003146 mailed Jun. 7, 2011.
International Search Report and Written Opinion for PCT Application No. PCT/US2011/000402 mailed Sep. 30, 2011.
International Search Report and Written Opinion for PCT/US2011/000398 mailed Aug. 30, 2011.
International Search Report and Written Opinion for PCT/US2011/000406 mailed Sep. 15, 2011.

(56) References Cited

OTHER PUBLICATIONS

International Search Report and Written Opinion for counterpart PCT Application No. PCT/US2011/000397 mailed May 24, 2011.
International Search Report and Written Opinion for PCT/US2011/000403 mailed Aug. 23, 2011.
International Search Report and Written Opinion for PCT/US2011/000404 mailed Aug. 25, 2011.
International Search Report and Written Opinion for PCT/US2011/000407 mailed Nov. 16, 2011.
Decision for Final Rejection for Japanese Patent Application No. 2001-542133 mailed Jun. 28, 2011.
International Search Report and Written Opinion from PCT Application No. PCT/US2012/044705 dated Oct. 9, 2012.
Notice to Submit a Response from Korean Patent Application No. 30-2011-0008446, dated Oct. 22. 2012.
Notice to Submit a Response from Korean Design Patent Application No. 30-2011-0024961, dated Sep. 10, 2012.
International Search Report and Written Opinion for PCT Patent Application No. PCT/US2011/000405 mailed Nov. 2, 2011.
International Search Report and Written Opinion, PCT/US2009/063804, Mailed on Feb. 26, 2010.
U.S. Appl. No. 12/566,195, Van De Ven, filed Sep. 24, 2009.
U.S. Appl. No. 12/704,730, Van De Ven, filed Feb. 12, 2010.
C.Crane Geobulb®-II LED Light Bulb, Item #2SW, Description, p. 1-2.
Cree LR4, 4" and 6" Recessed Architectural Downlight, Product Info p. 1-2.
International Search Report and Written Opinion for PCT/US2011/000400 mailed May 2, 2011.
Notice to Submit a Response from Korean Patent Application No. 30-2011-0008448, dated Apr. 16, 2012.
Notice to Submit a Response from Korean Patent Application No. 30-2011-0008445, dated Apr. 16. 2012.
Notice to Submit a Response from Korean Patent Application No. 30-2011-0008446, dated Apr. 16. 2012.
Office Action for Taiwanese Patent Application No. 100300961, dated May 7, 2012.
Office Action from Taiwanese Patent Application No. 100300960, dated May 7, 2012.
International Search Report and Written Opinion for PCT Application No. PCT/US2011/000391 mailed Oct. 6, 2011.
International Search Report and Written Opinion for PCT Application No. PCT/US2011/000399 mailed Jul. 12, 2011.
Decision to Refuse a European Patent Application for EP 09 152 962.8 dated Jul. 6, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No 2011-231319, dated Apr. 14, 2014.
Summons to Oral Proceedings from European Patent Appl. No. 09152962/2166580, dated Jan. 29, 2015.
First Office Action from Chinese Patent Appl. No. 2011800225832, dated Jan. 20, 2015.
First Office Action from Chinese Patent Appl. No. 2011800226214, dated Dec. 25, 2014.
Second Office Action and Search Report from Chinese Patent Appl. No. 2011800207092, dated Jan. 22, 2015.

Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757. dated Feb. 9, 2015.
Office Action from U.S. Appl. No. 13/029,063, dated Jan. 13, 2015.
Office Action from U.S. Appl. No. 12/901,405, dated Feb. 4, 2015.
First Office Action from Chinese Appl. No. 201180022626.7, dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Office Action from Japanese Patent Appl. No. 2014-122643, dated Apr. 10, 2015.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.
Office Action from Japanese Patent Appl. No. 2012-556064, dated Oct. 29, 2013.
Office Action from U.S. Appl. No. 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Office Action from U.S. Appl. No. 13/029,025, dated Dec. 6, 2013.
Office Action from Japanese Patent Appl. No. 2012-556066, dated Mar. 14, 2014.
Second Office Action from Chinese Patent Appl. No. 2011800223837, dated Apr. 13. 2015.
Communication from European Patent Appl. No. 13762957.2-1757, dated Apr. 30. 2015.
Third Office Action from Chinese Patent Appl. No. 2011800207069, dated Apr. 13, 2015.
Second Office Action from Chinese Patent Appl. No. 2011800226248, dated May 4, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Apl. No. 10420724800, dated Jun. 2, 2015.
Office Action from U.S. Appl. No. 11/149,999, dated Mar. 31, 2015.
Search Report and Office Action from Taiwanese Patent Appl. No. 099143827, dated Jun. 12. 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.
Decision to Grant from Chinese Patent Appl. No. 201080062056.X, dated Jul. 6, 2015.
Office Action from Taiwanese Appl. No. 101107038, dated Jul. 21, 2015.
Office Action from Taiwanese Patent Appl. No. 100107042. dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Office Action from Taiwanese Patent Appl. No. 100107048, dated Apr. 24, 2015.

(56) References Cited

OTHER PUBLICATIONS

Second Office Action from Chinese Patent Appl. No. 2011800223856, dated Apr. 16, 2015.
Notice of Decline of Amendments and Final Office Action from Japanese Appl. No. 2012-556065, dated Apr. 10, 2015.
Second Office Action from Chinese Patent Appl. No. 2011800223837, dated Apr. 13, 2015.
Communication from European Patent Appl. No. 13762957.2-1757, dated Apr. 30, 2015.
Office Action and Search Report from Taiwanese Patent Appl. No. 100107051, dated May 12, 2015.
Third Office Action from Chinese Patent Appl. No, 2011800207069, dated Apr. 13, 2015.
Second Office Action from Chinese Patent Appl. No. 2011800226248. dated May 4, 2015.
Office Action from Taiwanese Appl. No. 100107047, dated Jun. 5, 2015.
Second Office Action from Chinese Appl. No. 201180022620X, dated Apr. 20. 2015.
Office Action from Taiwanese Appl. No. 100107040. dated Jun. 5, 2015.
Office Action from Taiwanese Patent Appl. No, 10420724800, dated Jun. 2, 2015.
Office Action from U.S. Appl. No. 13/029,068, dated Mar. 31, 2015.
Office Action from U.S. Appl. No. 11/149,999, dated Nov. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Office Action from U.S. Appl. No. 14/185,123, dated Jun. 9, 2015.
Notification of the Fourth Office Action from Chinese Patent Appl. No. 2011800207069, dated Aug 24. 2015.
Decision of Rejection from Japanese Patent Appl. No. 2012-566065, dated Aug. 18. 2015.
Second Office Action from Chinese Patent Appl. No. 2011800226267, dated Aug. 3, 2015.
Office Action from U.S. Appl. No. 13/029,025, dated Aug. 17, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,068, dated Sep. 8, 2015.
Office Action from U.S. Appl. No. 13/029,263, dated Sep. 17, 2015.
Office Action from U.S. Appl. No. 11/149,999, dated Oct. 1, 2015.
Third Office Action from Chinese Patent Appl. No. 2011800207092, dated Jul. 13, 2015.
Notice of Allowance from Japanese Patent Appl. No. 2014-122643, dated Sep. 3, 2015.

* cited by examiner

FIG. 8 far-field
(1m observing distance)

- - - - - - Ø = 0°
———— Ø = 30°
— - — Ø = 60°
———— Ø averaged

LED BASED PEDESTAL-TYPE LIGHTING STRUCTURE

This application is a divisional of U.S. application Ser. No. 12/848,825 to Tong et al., entitled "LED BASED PEDESTAL-TYPE LIGHTING STRUCTURE", filed on Aug. 2, 2010, and claims the benefit of U.S. Provisional Patent Application Ser. No. 61/339,516 to Tong et al., entitled "LED Lamp Incorporating Remote Phosphor With Heat Dissipating Features", filed on Mar. 3, 2010, and U.S. Provisional Patent Application Ser. No. 61/339,515, filed on Mar. 3, 2010.

BACKGROUND OF THE INVENTION

1. Field of the Invention

This invention relates to solid state lamps and bulbs and in particular to light emitting diode (LED) based lamps and bulbs capable of providing omnidirectional emission patterns similar to those of filament based light sources.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1a, since it may be difficult to extract heat through the leads 15A, 15B.

Figures 1, 2:
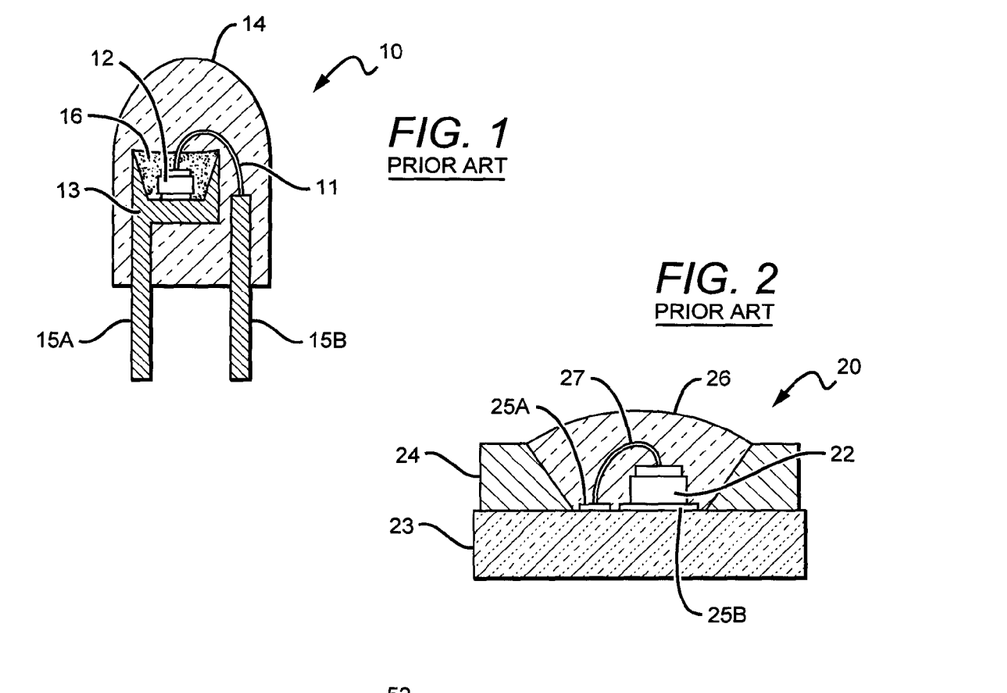
FIG. 1 shows a sectional view of one embodiment of a prior art LED lamp.
FIG. 2 shows a sectional view of another embodiment of a prior art LED lamp.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

In these embodiments the phosphor material is on or in close proximity to the LED epitaxial layers and in some instances comprises a conformal coat over the LED. In these arrangements, the phosphor material can be subjected to direct chip heating which can cause the phosphor material to heat. This elevated operating temperature can cause degradation of the phosphor material over time. It can also cause a reduction in phosphor conversion efficiency and a shift in conversion color.

Lamps have been developed utilizing solid state light sources, such as LEDs, with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light through a phosphor. In some embodiments, the separator spaces the light source a sufficient distance from the disperser such that heat from the light source will not transfer to the disperser when the light source is carrying elevated currents necessary for room illumination.

LED based bulbs have been developed that utilize large numbers of low brightness LEDs (e.g. 5 mm LEDs) mounted to a three-dimensional surface to achieve wide-angle illumination. These designs, however, do not provide optimized omnidirectional emission that fall within standard uniformity requirements. These bulbs also contain a large number of interconnected LEDs making them prohibitively complex, expensive and unreliable. This makes these LED bulbs generally impractical for most illumination purposes.

Other LED bulbs have also been developed that use a mesa-type design for the light source with one LED on the top surface and seven more on the sidewalls of the mesa. (see GeoBulb®-II provided by C. Crane). This arrangement, however, does not provide omnidirectional emission patterns, but instead provides a pattern that is substantially forward biased. The mesa for this bulb also comprises a hollow shell, which can limit its ability to thermally dissipate heat from the emitters. This can limit the drive current that can be applied to the LEDs. This design is also relatively complex, using several LEDs, and not compatible with large volume manufacturing of low-cost LED bulbs.

SUMMARY OF THE INVENTION

The present invention provides various embodiments of lamps and bulbs that are efficient, reliable and cost effective and can be arranged to provide an omnidirectional emission pattern. Different embodiments can comprise solid state emitters arranged on a pedestal having thermal management features to control heat build-up in the emitters. These embodiments can also comprise shaped remote phosphors that can also have thermal management features to control conversion heat build-up in the remote phosphor. Different embodiments can also have diffuser features to generate the desired emission pattern for the lamps and bulbs.

One embodiment of a lamp according to the present invention comprises a pedestal and a solid state light source on the pedestal. A shaped phosphor is arranged remote to the solid state light source so that at least some light from the solid state light source passes through the remote phosphor and is converted to a different wavelength of light. A diffuser is included to diffuse light emitting from the lamp in an omnidirectional emission pattern.

One embodiment of an LED based bulb according to the present invention comprises an elongated pedestal with multiple surfaces. A plurality of LEDs are included each of which can be mounted to one of the surfaces, with the pedestal comprising a thermally conductive path to conduct heat away from the LEDs. A diffuser is arranged in relation to the LEDs so that light from the LEDs passes through the diffuser, with the diffuser modifying the emission pattern of the LEDs producing the desired bulb emission pattern.

Another embodiment of a solid state lamp according to the present invention comprises a pedestal having a plurality of solid state light sources, wherein the pedestal at least partially comprises a thermally conductive material. A heat sink structure is included with the pedestal thermally coupled to the heat sink structure. Heat from the solid state light sources conducts to the heat sink structure through the pedestal. A remote phosphor is included that is thermally coupled to the heat sink structure with heat from the remote phosphor conducting into the heat sink structure.

Another embodiment of an LED based bulb according to the present invention comprises a pedestal having a plurality of LEDs, wherein the pedestal at least partially comprises a thermally conductive material. A heat sink structure is included with the pedestal thermally coupled to the heat sink structure. A remote phosphor is arranged in relation to the LEDs so that at least some light from the LEDs passes through the remote phosphor and is converted to a different wavelength of light. The bulb emits a white light combination of light from the LEDs and the remote phosphor.

One embodiment of a bulb or lamp light source according to the present invention comprises a plurality of solid state light emitters and a pedestal having a top surface. The pedestal also has a plurality of first side surfaces and a plurality of second side surfaces. The first side surfaces can be at an angle greater than 90 degrees to the top surface and the second side surfaces can be at an angle less than 90 degrees to the top surface. The solid state light sources are mounted to at least some of the first and second side surfaces.

These and other further features and advantages of the invention would be apparent to those skilled in the art from the following detailed description, taken together with the accompanying drawings, in which:

DETAILED DESCRIPTION OF THE INVENTION

The present invention is directed to different embodiments of a lamp structure providing LED chips mounted to a thermally conductive pedestal. This allows for the LED lamp to near uniform omnidirectional light emission pattern modeling that of a traditional incandescent light bulb. Some LED bulbs according to the present invention are particularly applicable to uses as A-bulb replacement LED lamps. The embodiments according to the present invention consists of a particular shaped pedestal having surfaces compatible for mounting solid state emitters, and the pedestals can be made of thermally conductive materials or have elements that provide thermal conduction away from the emitters. Some embodiments of the pedestal can contain multiple LED based emitters, at least some of which emit in different directions away from the pedestal. When used with remote phosphor and diffuser domes, the particular angles and emission patterns of the LEDs can give the lamps an omnidirectional emission pattern.

Some pedestals according to the present invention can be mounted to a heat sink structure so that heat conducted away from the emitters can spread into the heat sink structure where it can dissipate in the ambient. This arrangement also allows for the pedestal to be easily combined with a shaped remote phosphor having good special color uniformity, with the remote phosphor also being mounted to the heat sink. The remote phosphor can take many different shapes, such as a general globe-shape with the pedestal at least partially arranged within the globe shaped phosphor. This provides an arrangement that produces improved greater color uniformity by the pedestal and its emitters providing an approximate point light source within the remote phosphor. Light emitted from the pedestal emitter passes through the phosphor material with approximately the same angle and approximately through the same amount of phosphor. That is, the optical path through the phosphor for the photons from the pedestal emitters is approximately the same, giving the LED bulb greater emission color uniformity.

This approximate point source arrangement also provides for more uniform emission at different viewing angles, which makes some of the embodiments particularly applicable to replacing standard incandescent based light sources. As further discussed below, the remote phosphor arrangement can also be characterized as having higher photon conversion efficiency because of improved thermal management.

Different solid state emitters can be included on the pedestal, such as LEDs, LED chips or other LED packages/components ("LED chip" or "LED chips"). In some embodiments the pedestal can be utilized in lamps emitting white light, with the lamps emitting a white light combination of light from the LEDs on the pedestal and light from the one or more phosphors in the remote phosphor. In some embodiments the pedestal can comprise blue emitting LED chips and the shaped remote phosphor can comprise a phosphor material that absorbs blue light and emits yellow light. During operation a portion of the blue LED chip light passes through the remote phosphor, while the remainder is absorbed by the yellow phosphor and re-emitted as yellow light or green light, with these lamps emitting a white light combination of blue LED light and phosphor light. Lamps according to the present invention can also comprise different LEDs emitting different colors of light and conversion materials, absorbing light and re-emitting different colors of light so that the lamp emits light with the desired characteristics such as color temperature and color rendering.

The lamps according to the present invention can have fewer components and can be easier and cheaper to manufacture. For example, by having a remote phosphor the LED chips on the pedestals can be driven with a higher drive current without the danger of heat from the LED chips degrading the phosphor. Accordingly, fewer LED chips are needed to achieve the desired lamp luminous flux. The pedestal also provides a cost effective way of mounting multiple emitters while at the same time providing a thermal path to dissipate heat from the emitters.

The present invention is described herein with reference to certain embodiments, but it is understood that the invention can be embodied in many different forms and should not be construed as limited to the embodiments set forth herein. In particular, the present invention is described below in regards to certain lamps or lighting components having LEDs, LED chips or LED components ("LED chips") in different configurations, but it is understood that the present invention can be used for many other lamps having many different configurations. The components can have different shapes and sizes beyond those shown and different numbers of LEDs or LED chips can be included.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 3:
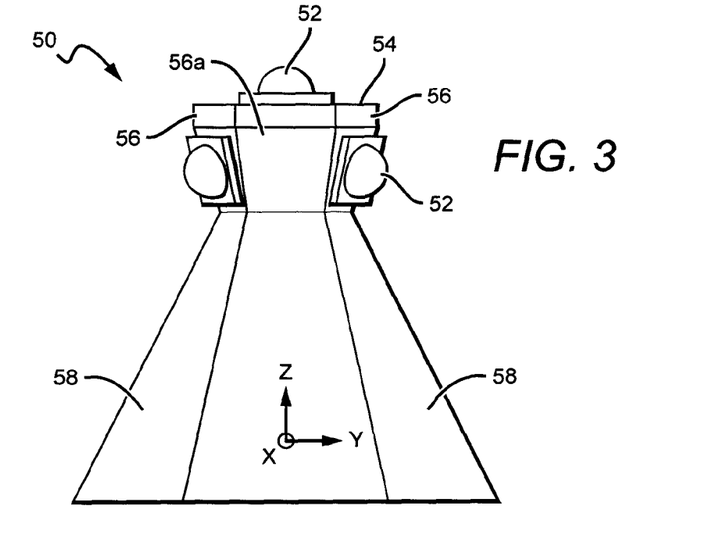
FIG. 3 is a side elevation view of one embodiment of a pedestal according to the present invention.

FIG. 3 shows one embodiment of a LED pedestal 50 according to the present invention that is arranged to hold LED chips 52 within an LED lamp or bulb ("LED lamp"), with the pedestal 50 and its LED serving as the light source for the LED lamp. The pedestal 50 is generally elongated and can have multiple surfaces that can hold multiple LED chips at different angles. In the embodiment shown, the pedestal 50 has a top surface 54 with an LED chip 52 mounted to the top surface 54. When the pedestal 50 is mounted vertical, the top surface is approximately horizontal. The pedestal also comprises a plurality of pedestal emitter surfaces 56 at least some of which are also arranged to hold an LED chip 52. It is understood that the pedestal 50 can have many shapes and different numbers and sizes of emitter surfaces 56 that can be arranged at different angles to the top surface 54. In the embodiment shown, there are six emitter surfaces each of which is on the upper part of the pedestal and each of which is substantially the same size and has the same angle. In the embodiment shown the side surfaces are at an angle greater than 90° to the top surface 54 so that the thickness of the pedestal 50 reduces moving down from the top surface 54. In some embodiments the side surface angle can be approximately 95° or more to the top surface, while in other embodiments the side surface angle can be approximately 100° or more to the top surface. In still other embodiments the side surface angle can be approximately 105° or more to the top surface. In one embodiment, the side surface angle is approximately 105° to the top surface.

LED chips 52 can be included on at least some of the emitter side surfaces 56 and in the embodiment shown, an LED chip 52 is included on three of the side surfaces 56. Many different commercially available LED chips or LED packages can be used including but not limited to those commercially available from Cree, Inc., located in Durham, N.C. The LED chips are mounted in place using known methods and materials as described below. In this embodiment, an uncovered side surface 56a is included between the side surfaces 56 having an LED chip 52, but it is understood that in other embodiments of the LED chips 52 can be mounted to some or all of the uncovered side surfaces 56a so there is not an uncovered side surface between some or all of the LED chips. The number of LED chips included on the top and side surfaces is dependent upon luminous flux of the LED chips 52 as well as the desired luminous flux and light emission pattern for the LED lamp utilizing the pedestal 50. Each of the top and side surfaces 54, 56 can have none or more than one LED chips in different embodiments. By having emitters on the top surface 54 and the side surfaces 56, light is emitted from the pedestal up and to the side at a slight downward angle. This combination of lighting directions is compatible with providing omnidirectional lamp emission when the light is dispersed as described below.

The pedestal 50 also comprises base side surfaces 58 below the side surfaces 56 and 56a, and in the embodiment shown there are the same number of base side surfaces 58 and emitter side surfaces 56 and 56a, with the base side surfaces 58 comprising a continuation of the emitter side surfaces 56. It is understood that in other embodiments there can be a different number of base side surfaces 58 or the pedestal can take different shapes in this region, such as cylindrical. In the embodiment shown, the base surfaces have an angle less than 90° to the top surface 54 such that the width of the pedestal increases in this area moving down. It is understood that the base side surfaces 58 can be at many different angles to the top surface 54, with a suitable angle being approximately 70° or more. In some embodiments the angle can be greater than 90°. In some embodiments the base side surfaces can also have an LED chip depending on the desired LED lamp luminous flux and emission pattern. In the embodiment shown the side surfaces do not have LED chips.

The pedestal 50 can also include the necessary electrical conductors (not shown) for applying an electrical signal to the LED chips 52. This can include conductive traces, wire bonds, or insulation coated wires. The LED chips can be interconnected in different serial and parallel arrangements and in some embodiments, the LED chips are interconnected so that a single electrical signal can cause all the LED chips 52 to emit light.

The pedestal 50 can at least partially comprise a thermally conductive material, and many different materials can be used such as different metals including copper, aluminum, or metal alloys. Different embodiments of the pedestal 50 should be arranged with the necessary features to adequately conduct heat away from the LED chips. In some embodiments the pedestal 50 can have internal solid sections that provide a heat path, with the pedestal being greater that 50% solid. In still other embodiments the pedestal 50 can be greater than 70% solid, while in other embodiments it can be approximately 100% solid. In embodiments where the pedestal is substantially hollow, heat dissipation devices can be included, such as heat pipes, to conduct LED chip heat. The pedestals can be fabricated using many different known methods as described below, such as die cast or metal stamping.

The surfaces of the pedestal 50 should comprise a reflective layer/surface, particularly in those areas not covered by the LED chips 52. In the LED lamp embodiments described below that utilize a remote phosphor, approximately 50% of phosphor emission is backward toward the pedestal due to the isotropic nature of phosphor emission. In other embodiments using a diffusing dome, some of the light passing through the dome can be scattered back toward the pedestal 50. A pedestal 50 with surfaces having good reflectivity can improve lamp emission efficiency reflecting at least some of the back emitted/scattered photons so that they contribute to useful emission of the LED lamp. LED chips and component substrates typically have lower effective reflectivity due to extraction loss and/or low surface reflectivity. Including reflective surfaces not covered by the LED chips increases the emission efficiency of the LED lamps. It is understood that the reflective layer/surface can comprise many different materials and structures including but not limited to white paint, reflective particles, reflective metals or multiple layer reflective semiconductor structures such as distributed Bragg reflectors (DBRs). In some embodiments the surfaces can be coated with a material having a reflectivity of approximately 75% or more to lamp light, while in other embodiments the material can have a reflectivity of approximately 85% or more to the lamp light. In still other embodiments the material can have a reflectivity to the lamp light of approximately 95% or more.

Figure 4:
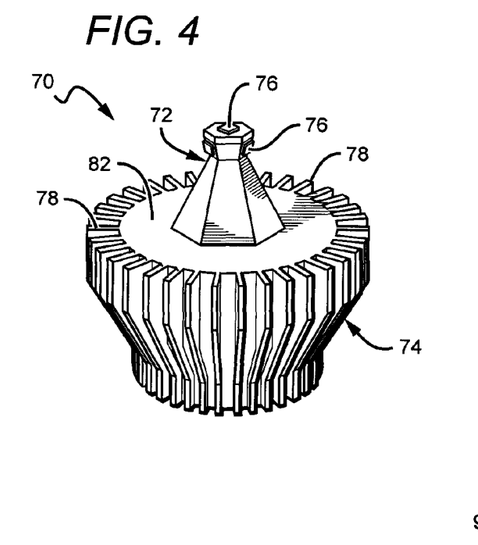
FIG. 4 is a perspective view of one embodiment of an LED lamp according to the present invention.

The pedestal 50 can be mounted in many different LED lamps according to the present invention that can have many different features. FIG. 4 shows an LED lamp 70 comprising a pedestal 72 that is similar to pedestal 50 described above. Pedestal 72 is mounted to a heat sink structure 74 with good thermal contact between the two. LED chips 76 are mounted to surfaces of the pedestal 72 and interconnected using conductors as described above.

The heat sink structure 74 can at least partially comprise a thermally conductive material, and many different thermally conductive materials can be used such as different metals including copper, aluminum, or metal alloys. The heat sink structure 74 can also comprise other heat dissipation features such as heat fins 78 that increase the surface area of the heat sink to facilitate more efficient dissipation into the ambient. Heat sink reflective layers or materials can also be included on surfaces of the heat sink structure 74 to reflect light as described above for the reflective layer/surfaces of the pedestal 50. In one embodiment, the top surface 82 of the heat sink structure 74 around the pedestal 72 can comprise a reflective layer that can be made of the materials described above and can be formed on the heat sink structure 74 using known methods.

The pedestal 72 can be mounted to the heat sink structure 74 using different known methods or materials such as thermally conductive bonding materials or a thermal grease. Conventional thermally conductive grease can contain ceramic materials such as beryllium oxide and aluminium nitride or metal particles such as colloidal silver. In other embodiments the pedestal 72 can be mounted to the heat sink structure by thermal conductive devices such as by clamping mechanisms, screws, or thermal adhesive. These devices and materials can hold the pedestal tightly to the heat sink structure 74 to maximize thermal conductivity. In one embodiment a thermal grease layer is used having a thickness of approximately 100 μm and thermal conductivity of k=0.2 W/m-k. This arrangement provides an efficient thermally conductive path for conducting heat from the pedestal 72 to the heat sink structure.

The heat sink structure 74 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, and can comprise a screw-threaded portion which can be screwed into an Edison socket. In other embodiments, it can include a standard plug and the electrical receptacle can be a standard outlet, or can comprise a GU24 base unit. In other embodiments it can comprise a clip and the electrical receptacle can be a receptacle which receives and retains the clip (e.g., as used in many fluorescent lights). These are only a few of the options for heat sink structures and receptacles, and other arrangements can also be used.

In some embodiments, the heat sink structure 74 can comprise electrical conductors for applying an electrical signal from the electrical receptacle to the pedestal 72 and then to its LED chips 76. Power units (not shown) can also be included to condition or modify the electrical signal from the receptacle before it is applied to the pedestal 72. This can include signal conversion (e.g. analog to digital conversion, signal rectification and/or signal amplification or reduction.

Figure 5:
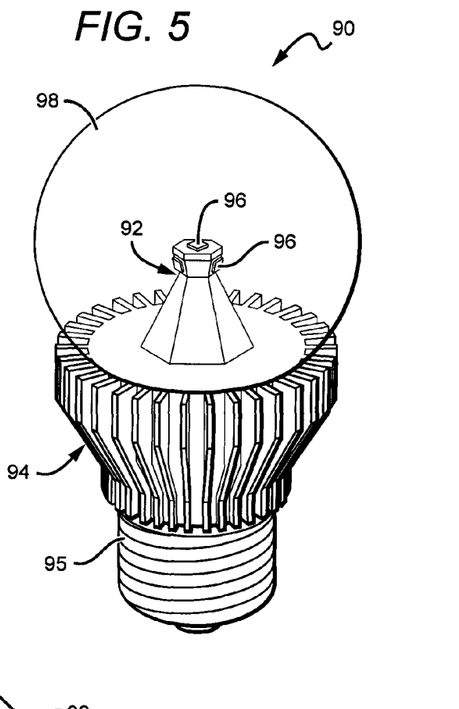
FIG. 5 is a perspective view of another embodiment of an LED lamp according to the present invention.

FIG. 5 shows one embodiment of an LED lamp 90 according to the present invention comprising a pedestal 92, heat sink structure 94, and LED chips 96 arranged similarly to those same features described above and shown in FIG. 4. In this embodiment, the LED lamp 90 comprises a shaped remote phosphor 98 arranged around the pedestal 92 so that at least some light from the LED chips 96 passes through the remote. The remote phosphor 98 can take many different shapes according to the present invention, such as hemispheric, oval, cone-shaped, etc., and can be many different sizes. In some embodiments the remote phosphor can provide less than full coverage over the pedestal 92. In the embodiment shown, the remote phosphor 98 is in the shape of a globe that is mounted to the heat sink structure 94, with the pedestal 92 and its LED chips 96 arranged at least partially within the globe shaped phosphor 98. The lamp 90 also comprises a screw-threaded portion 95 for mounting the lamp 90 to a Edison socket.

Many different phosphors can be used in the shaped phosphor 98 with the present invention being particularly adapted to lamps emitting white light. (phosphor layer or mixed in). As described above, in some embodiments according to the present invention the LED chips 96 can emit light in the blue wavelength spectrum and the shaped phosphor 98 can absorb at least some of the blue light and re-emit yellow (or green). This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors can be used for creating white light when used with a blue emitting LED based emitter including but not limited to: $Tb_{3-x}RE_xO_{12}$:Ce(TAG); RE=Y, Gd, La, Lu; or $Sr_{2-x-y}Ba_xCa_ySiO_4$:Eu.

The shaped phosphor 98 can comprise a second phosphor material that can either be mixed in with the shaped remote phosphor 98 or can be included on the shaped phosphor as a second layer. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}S$:Eu, Y; Y=halide;
$CaSiAlN_3$:Eu; or
$Sr_{2-y}Ca_ySiO_4$:Eu

Other phosphors can be used to create color emission by converting substantially all light to a particular color. For example, the following phosphors can be used to generate green light:

$SrGa_2S_4$:Eu;
$Sr_{2-y}Ba_ySiO_4$:Eu; or
$SrSi_2O_2N_2$:Eu.

The following lists some additional suitable phosphors, although others can also be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}{}_{0.06}$
$(Ba_{1-x-y}Sr_xCa_y)SiO_4$:Eu
$Ba_2SiO_4$:Eu$^{2+}$ Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light.

In some embodiments, a transparent material in a globe shape can be provided and a phosphor can be deposited on the inside or outside layers, or both. To form the layer, the phosphor can be provided in a binder, and the phosphor can also have different concentrations or loading of phosphor materials in the binder. A typical concentration being in range of 30-70% by weight. In one embodiment, the phosphor concentration is approximately 65% by weight, and is preferably uniformly dispersed throughout the remote phosphor. The shaped phosphor 98 can also have different regions with different conversion materials and different concentrations of conversion material.

Different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

Phosphor layers can be applied using different processes including but not limited to spin coating, sputtering, printing, powder coating. As mentioned above, the phosphor layers can be applied along with a binder material, but it is understood that a binder is not required. In still other embodiments, the phosphor layers can be separately fabricated and then mounted to the transparent globe.

The shaped remote phosphor 98 can also comprise improved thermal management features to reduce phosphor conversion heating. Phosphors can generate heat during operation simply from the light conversion process. In remote phosphor arrangements this heat can build-up to unacceptable levels if the remote phosphor has inadequate thermally conductive paths to dissipate the phosphor conversion heat. Without an effective heat dissipation pathway, thermally isolated remote phosphors may suffer from elevated operating temperatures that can lead to phosphor degradation, conversion inefficiency and color shifting.

In some embodiments the shaped remote phosphor 98 can comprise a transparent material that is thermally conductive material and is in the form of the desired remote phosphor shape. In the embodiment shown the remote phosphor is globe shaped, but as mentioned it can be many other shapes. The phosphor can be included as a layer on the globe shaped transparent material or can be mixed in with the globe material. During operation of the LED lamp phosphor conversion heating is concentrated in the phosphor material. The thermally conductive properties of the carrier globe helps spread this heat laterally toward the edges of the globe that in the embodiment shown are in contact with the heat sink structure 94. The globe is preferably mounted to the heat sink structure by a conductive material such as a thermal grease layer, and heat flows from the globe and into the heat sink structure where it can efficiently dissipate into the ambient.

The shaped transparent material can comprise different materials such as glass, quartz, silicon carbide (SiC), sapphire, or others. The shaped transparent material can also have different thicknesses, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be to in providing the necessary thermal dissipation. These materials can effectively spread heat laterally and as a result do not need the large area required by materials with lower thermal conductivity. Different factors can impact which material is used including but not limited to cost and transparency to the light source light.

Figure 6:
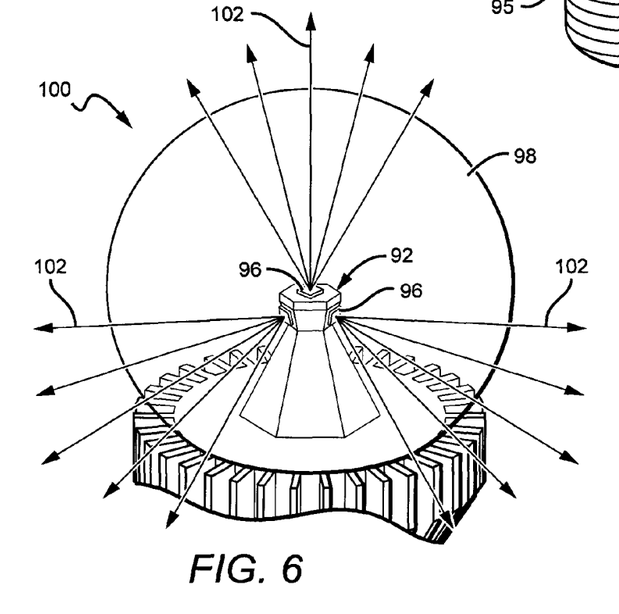
FIG. 6 is a perspective view of the LED lamp shown in FIG. 5 showing light rays from its light source.

Beyond the conversion efficiency of the pedestal 92 and shaped phosphor 98 arrangement discussed above, the arrangement can also provide conversion uniformity. Referring now to FIG. 6 a LED lamp 100 is shown that this similar to LED lamp 90, and for similar features the same reference numbers are used. The LED chips 96 are clustered at the top of the pedestal 92 and are within the shaped phosphor 98, preferably at or near the center of the shaped phosphor. This configuration allows the LED chips 96 to approximate a point source within the shaped phosphor 98 such that light rays 102 strike the shaped phosphor 98 at approximately the same angle and travel through the same optical path length through the remote phosphor (e.g. coated globe). Assuming that the shaped phosphor has approximately the same thickness throughout, the light rays will experience similar amounts of phosphor material and similar levels of light conversion. This allows for color uniformity to be maintained for the emitted light, for a remote phosphor having a phosphor coating with spatial consistency.

It is understood that the remote phosphors and pedestals can be arranged in many different ways according to the present invention. In some embodiments the remote phosphor can include scattering particles either in a layer on the shaped remote phosphor, mixed in with the phosphor material, or mixed in with the transparent thermally conductive material. The scattering particles can comprise many different materials including but not limited to:

silica gel;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); or
phosphor particles (e.g., YAG:Ce, BOSE)

More than one scattering material in various combinations of materials or combinations of different forms of the same material may be used to achieve a particular scattering effect. The shaped remote phosphor or diffuser dome can also include surface roughening or shaping to enhance light extraction.

Figure 7:
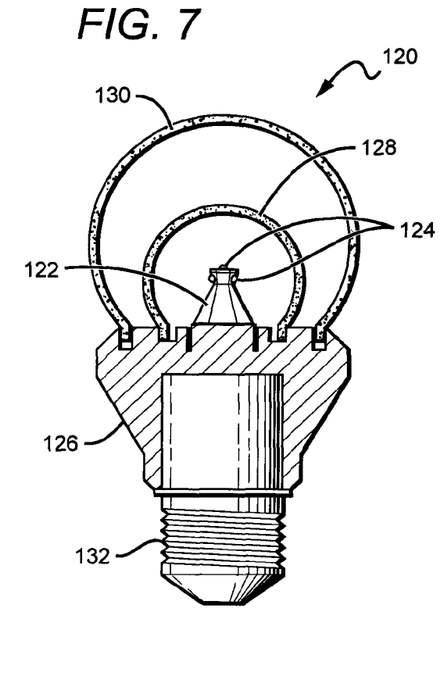
FIG. 7 is a sectional view of another embodiment of an LED lamp according to the present invention.

FIG. 7 shows embodiment of an LED lamp 120 according to the present invention that is similar to the LED lamp 90 shown in FIG. 5, and comprises a pedestal 122 with LED chips 124 mounted to its top and side surfaces. The pedestal 122 that is mounted to a heat sink structure 126 with a shaped remote phosphor 128 also mounted to the heat sink structure 126 over the pedestal 122. The lamp 120 also comprises a shaped diffuser dome 130 also mounted to the heat sink structure 126, but it is understood that it can be mounted in the lamp 120 in many different ways. The diffusing dome 130 can comprise diffusing or scattering particles such as those listed above. The scattering particles can be provided in a curable binder that is formed in the general shape of dome. In some embodiments white scattering particles can be used with the dome having a white color that hides the color of the phosphor in the shaped remote phosphor to give the LED lamp a generally white appearance. The diffuser dome is arranged to diffuse or scatter the light from the remote phosphor so that the LED lamp emits the desired pattern of light, such as omnidirectional light. The lamp 120 also comprises a screw-threaded portion 132 for mounting the lamp 120 to a Edison socket.

The diffuser dome can have many different shapes and can be arranged in many different ways in the lamps according to the present invention. In some embodiments, the diffuser dome and the phosphor material can comprise a single component. In some embodiments the phosphor comprises a layer on the diffuser or the phosphor and the diffuser materials can be mixed. In the case of lamp having blue emitting LED chips a diffusing dome can be used having phosphor material and neutral scattering particles so that the lamp emits a white light combination of light from the phosphor and LED chips.

Figure 8:
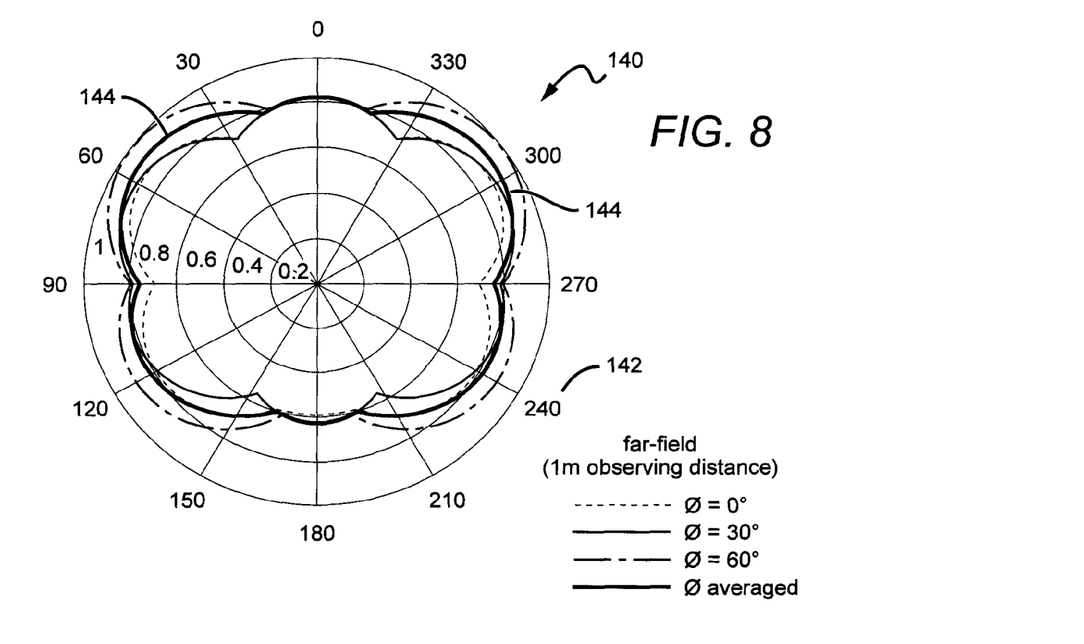
FIG. 8 is a polar diagram showing the emission pattern for one embodiment of an LED lamp according to the present invention.

As mentioned above, LED lamps according to the present invention can be arranged to provide omnidirectional emission patterns with limited emission variations at different emission angles. FIG. 8 is a polar diagram 140 showing the far field relative luminous intensity distribution over the angular space for one embodiment of an LED lamp according to the present invention. In the polar diagram 140, $\theta$ is the inclination angle from the z-axis as shown in FIG. 3 and $\phi$ is the azimuth angle from the x-axis. The numbers 142 around the circle refer to the inclination angle $\theta$, with 0° being directly above the top pedestal surface. The distribution from 0° to 180° is symmetric to that from 360° to 180°. The azimuthal angle $\phi$ is represented in the polar diagram as a number of slices with the slices forming a continuous band. The width of a band at a particular angle $\theta$ reflects how much intensity variation there is around the 360° azimuthal angle at this angle $\theta$. The aximuthal averaged line 144 represents the azimuthal-averaged intensity at each angle $\theta$. Use of a pedestal, remote phosphor and diffusing globe according to the present invention can effectively smooth out the variation around $\phi$. In the embodiment shown, for $\theta$ from 0° to 150°, the $\phi$-averaged (relative) intensity varies within 0.920 to 0.696. This corresponds to a ±13.8% intensity variation around the average value of 0.808. It is understood that other embodiments according to the present invention can provide different intensities variations both above and below this 13.8%.

In some lamp embodiments, larger shaped remote phosphor can provide a higher ratio of high reflectivity surface to LED chip/component surface areas, i.e. higher cavity reflectivity and efficiency. Larger remote phosphors can also reduce conversion density and related heat. That is, larger remote phosphor having a larger area tend to lower the incoming photon flux density per unit phosphor area. Larger remote phosphors can also allow for easier thermal management of the phosphor generated heat such that the phosphor operating temperature can be maintained close to ambient to enhance the phosphor efficiency and lifetime. These larger phosphors, however, can result in higher material costs for the larger remote phosphor, and an envelope for the lamp.

Figure 9:
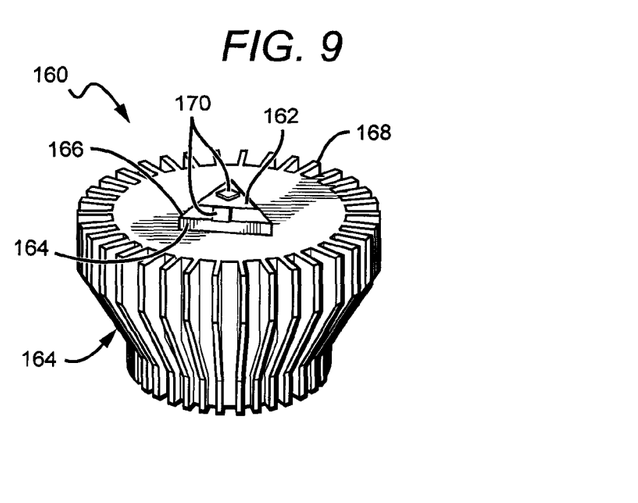
FIG. 9 is a perspective view of another embodiment of an LED lamp according to the present invention.

It is understood that many different pedestals can be used in different embodiments according to the present invention. FIG. 9 shows another embodiment of an LED lamp 160 according to the present invention comprising a pedestal 162 mounted to a heat sink 164. In this embodiment the pedestal is generally triangular-shaped with a top surface 166 and three side surfaces 168. An LED chip 170 is mounted to each of the surfaces 166, 168 with electrical connections (not shown) between the LED chips causing them to emit light in response to an electrical signal. The LED lamp 160 can also comprise a shaped remote phosphor or diffuser dome as described above.

Figure 10:
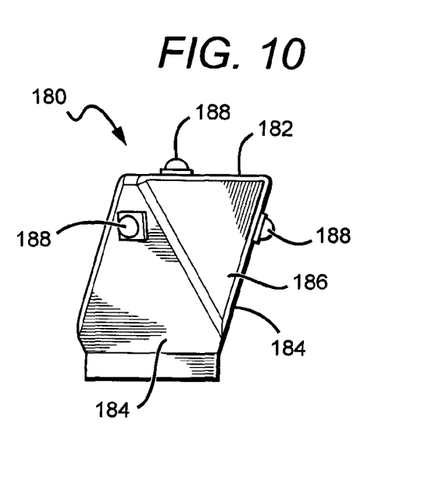
FIG. 10 is a side view of another embodiment of a pedestal according to the present invention.
Figure 11:
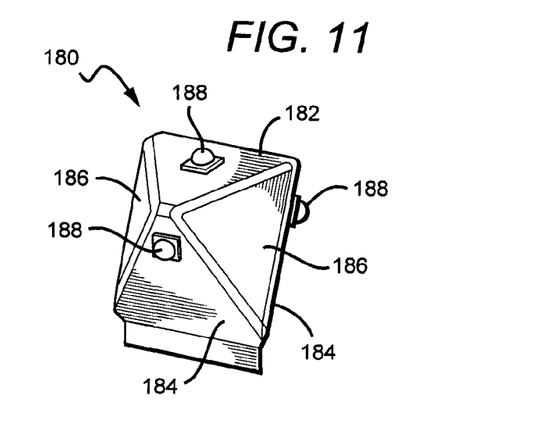
FIG. 11 is a perspective view of the pedestal shown in FIG. 10.

FIGS. 10 and 11 show another embodiment of a pedestal 180 according to the present invention having a top surface 182, three emitter side surfaces 184 and three open side surfaces 186. An LED chip 188 is mounted on the top surface 182 and one is mounted on each of the side emitter surfaces 184, with the pedestal having a total of four LED chips. Like the embodiments above, the LED chips 188 comprise electrical connections such that the LED chips 188 emit light in response to an electrical signal. In pedestal 180 the emitter side surfaces 184 have an angle greater than 90° to the top surface 182, with one embodiment having an angle of approximately 105° to the top surface. It is understood that the emitter surfaces 184 can be many different angles to the top surface 182. In this embodiment the open side surfaces 186 have an angle to the top surface that is less than 90° to the top surface 182.

Figure 12:
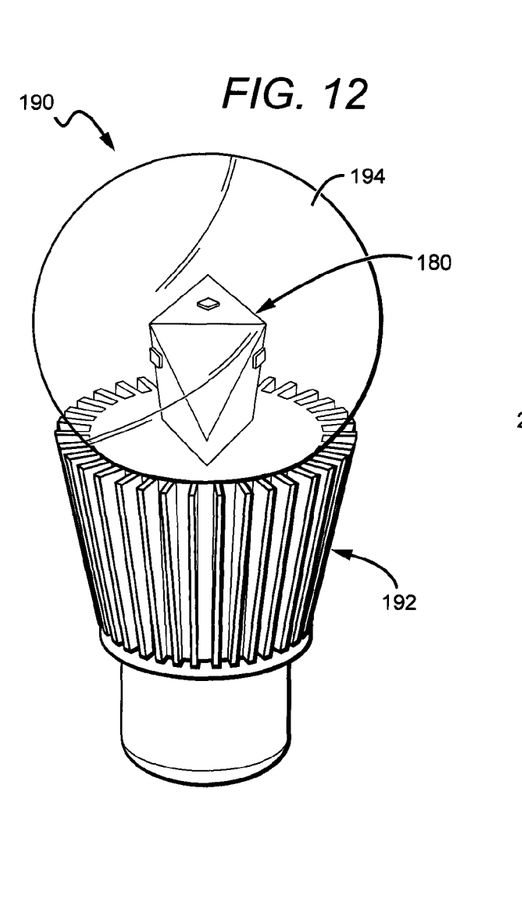
FIG. 12 is a perspective view of another embodiment of a lamp according to the present invention.

FIG. 12 is another embodiment of an LED lamp 190 according to the present invention utilizing the pedestal 180 shown in FIGS. 10 and 11. The pedestal 180 is mounted to a heat sink structure 192 with a remote shaped phosphor 194 made of the same materials and the shaped remote phosphors described above. The shaped remote phosphor is also mounted to the heat structure 192 with the pedestal 180 arranged in the remote phosphor 194. This embodiment can also comprise a diffuser dome to further scatter or diffuse the light into an omnidirectional pattern.

Figure 13:
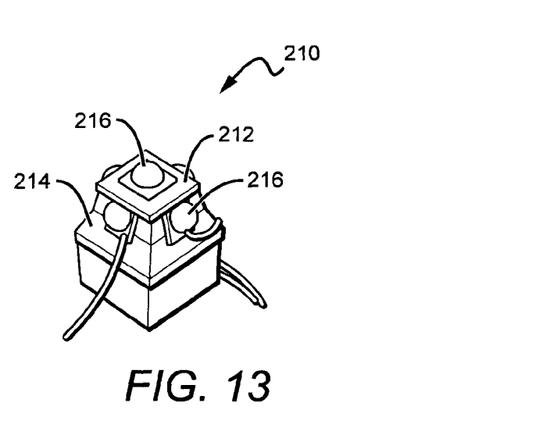
FIG. 13 is a perspective view of another embodiment of a pedestal according to the present invention.

FIG. 13 shows still another embodiment of a pedestal 210 according to the present invention having a top surface 212 and four emitter side surfaces 214. An LED chip 216 is included on each of these surfaces and interconnected as described above to emit light in response to an electrical signal. In this embodiment each of the emitter side surfaces 214 has an angle less than 90 degrees to the top surface 212. In this embodiment the side surfaces 214 are an angle of approximately 80° to the top surface 212, but it is understood that the side surfaces 214 can be at many other angles to the top surface 212 including but not limited to approximately 90°, 100°, 105° among others. Other pedestals according to the present invention can have different numbers of surfaces with different angles and orientations to produce the desired emission pattern. In the embodiment shown, the pedestal 210 comprises a substantially solid thermally conductive material, but it is understood that other embodiments can comprise pedestals that are hollow or have other features to dissipate heat such as heat pipes. The pedestal 210 can be utilized in different LED lamps according to the present invention including those having a heat sink structure, remote shaped phosphor and diffuser dome as described above.

Figure 14:
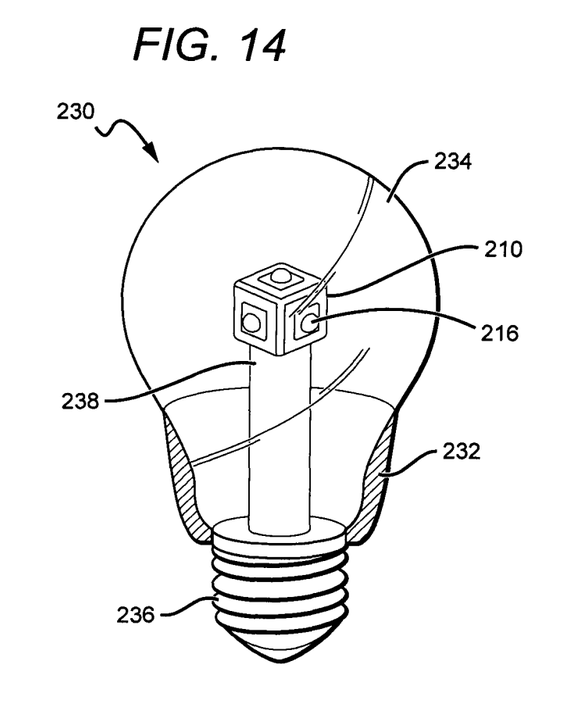
FIG. 14 is a perspective view of another embodiment of an LED lamp according to the present invention.

FIG. 14 shows one embodiment of an LED lamp 230 according to the present invention utilizing the pedestal 210 and its LED chips 216 similar to those shown in FIG. 13. The lamp 230 comprises a heat sink structure 232 and an enclosure 234 that can be either a remote shaped phosphor or a diffuser dome as described above. The LED lamp 230 further comprises a screw-threaded portion 236 for mounting to an Edison socket. In this embodiment, the pedestal 210 is mounted within the enclosure 234 by a heat pipe 238 that conducts heat from the pedestal 210 to conduct the heat to the heat sink structure 232 where it can more efficiently dissipate into the ambient. It is understood that other heat conductive elements can also be used in embodiments according to the present invention.

Figure 15:
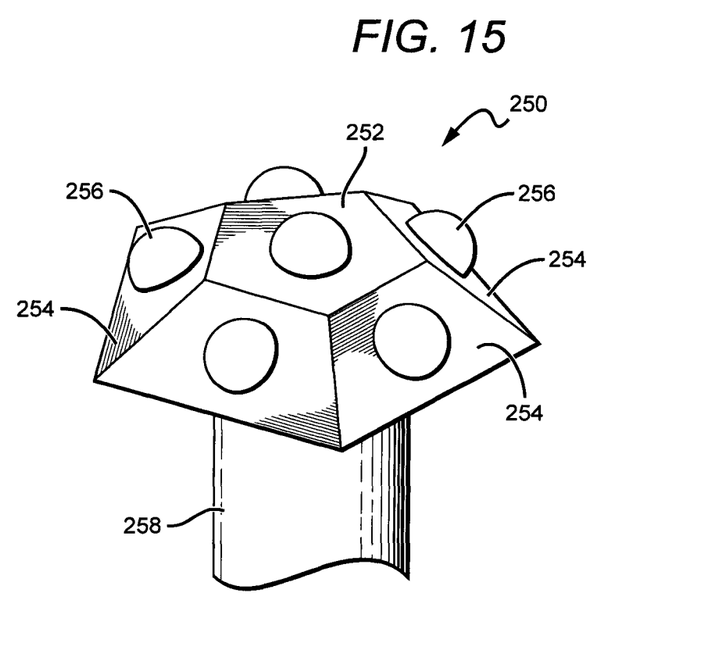
FIG. 15 is a perspective view of another embodiment of a pedestal according to the present invention.

It is also understood that many different pedestals can be arranged on a heat pipe as shown in FIG. 14. FIG. 15 shows another embodiment of a pedestal 250 having a top surface 252 and five emitter side surfaces 254, each of which has an LED chip 256 that can be electrically connected to the others as described above. In this embodiment the emitter side surfaces 254 have an angle to the top surface 252 of less than 90°, but in other embodiments some or all of them can have an angle to the top surface 252 of greater than 90°. The pedestal is mounted to a heat pipe 258 that conducts heat from the pedestal so that it can dissipate in the ambient, such as though a heat sink structure as described above.

Lamps according to the present invention can be arranged in many different ways beyond the embodiments described above. In some embodiments the LED chips mounted to the pedestal can be white emitters, such as warm white emitters. In some of these embodiments a shaped remote phosphor may not be needed to convert the light from the LED chips. The diffuser dome can contain neutral scattering elements to diffuse the LED chip light into the desired emission pattern. It is understood, however, that a shaped remote phosphor can also be used in embodiments having white emitters on the pedestal to further modify the emitter light. In still other embodiments the pedestal can contain white emitters and emitters of different color, with different embodiments of these lamps using remote phosphor and diffusers to produce the desired lamp emission.

The pedestals according to the present invention can be fabricated using different methods. As mentioned above, the pedestals can be stamped from sheet metal and then bent into the pedestal shape. This method of manufacture is cost effective, but the resulting pedestals are hollow and may not have the necessary ability to conduct heat from the emitters without the use of additional devices, such as heat pipes. It is understood, however, that stamped pedestals can be provided having additional thermal management features to provide the desired heat dissipation.

Alternatively the pedestals can be die cast, and although this requires an initial tooling cost, the fabrication of mass quantities following tooling makes these pedestals relatively cost effective in large quantities. Using the die cast method, an aluminum material can be used for the pedestal and the pedestal can be die cast with recesses at the places where the LED chips are to be mounted. The recessed areas should be the same shape and slightly larger than the LED chip footprint, and the recess depth should hold its LED chip so that the LED chip does not readily fall out of the recess. The pedestal can then have its surface electroplated with a thin Ni/Cu or Ni/Ag layer to enable reflowability. Dry films can then be stamped into the surfaces of the recessed areas and the full pedestal can be coated with a reflective coating such as white paint, reflective particles, reflective metals, DBRs, etc. The dry films can then be removed from recessed areas to expose the Cu or Ag surfaces within the recesses, and a solder past can then be applied to the surfaces. LED chips can then be placed in the recesses, such as by pick and place methods. In some embodiments the LED chips can have electrically isolated backside metallization surfaces. The recess and surface tension of the solder paste can hold the LED chips in place before reflow. For slanted surfaces, the pedestal can be oriented such that gravity assists in holding the LED chips in their recesses. In the case of the pedestal having surfaces at above 90° to the top surface, the pedestal should be held upside down the hold the LED chips in the side surface recesses. The pedestal can then be reflowed and pedestals having an LED chip on the top surface may need to be reflowed a second time. Front side electrical wiring can be included to interconnect the LED chips.

It is understood that different fabrication methods according to the present invention can have more or fewer steps than those described above and can have different steps when utilizing different components. For example, in the case of surface mount LEDs on a metal-core printed circuit board a different method can be used to mount to the pedestal. Grooves can be cut in the metal core PCB that allow it to be bent so it can wrap around the pedestal. A eutectic solder can be used to bond the metal core PCB to the pedestal.

Although the present invention has been described in detail with reference to certain preferred configurations thereof, other versions are possible. Therefore, the spirit and scope of the invention should not be limited to the versions described above.

We claim:

1. A light emitting diode (LED) based bulb, comprising:
   an elongated pedestal comprising multiple surfaces, wherein said pedestal comprises a top surface and at least one side surface such that said at least one side surface has an angle greater than 90 degrees to said top surface;
   a plurality of LEDs, each of which can be mounted to one of said surfaces, said pedestal comprising a thermally conductive path to conduct heat away from said LEDs; and
   a diffuser arranged in relation to said LEDs so that light from said LEDs passes through said diffuser, with said diffuser modifying the emission pattern of said LEDs producing the desired bulb emission pattern.

2. The bulb of claim 1, wherein said diffuser modifies the emission pattern of said LED into an omnidirectional pattern.

3. The bulb of claim 1, wherein said diffuser comprises a diffuser dome.

4. The bulb of claim 1, further comprising a shaped phosphor arranged remote to said LEDs so that at least some light from said LEDs passes through said remote phosphor and is converted to a different wavelength of light.

5. The bulb of claim 1, further comprising a heat sink structure wherein said thermally conductive path is thermally coupled to said heat sink structure.

6. The bulb of claim 5, further comprising a remote phosphor mounted to said heat sink structure with heat from said remote phosphor conducting to said heat sink.

7. The bulb of claim 1, wherein said pedestal at least partially comprises a thermally conductive material.

8. The bulb of claim 1, comprising multiple side surfaces having an angle greater than 90 degrees to said top surface, at least one of said LEDs on at least some of said side surfaces.

9. The lamp of claim 1, wherein said pedestal has a top surface and multiple side surfaces having an angle greater than approximately 105 degrees to said top surface.

10. The bulb of claim 4, wherein said LEDs are arranged with respect to said remote phosphor so that the rays of light emitting in different directions from said LEDs pass through the same thickness of said remote phosphor.

11. The bulb of claim 4, wherein said LEDs approximate a point light source within said remote phosphor.

12. The bulb of claim 2, having an omnidirectional emission pattern with intensity variation of approximately +20 percent or less.

13. The lamp of claim 2, having an omnidirectional emission pattern with intensity variation of approximately +15 percent or less.

14. A bulb or lamp light source, comprising:
   a plurality of solid state light emitters;
   a pedestal having a top surface, a plurality of first side surfaces and a plurality of second side surfaces, wherein said first side surfaces are at an angle greater than 90 degrees to said top surface and said second side surfaces are at an angle less than 90 degrees to said top surface, said solid state light sources on at least some of said first and second side surfaces.

15. The light source of claim 14, wherein said solid state light sources comprise light emitting diodes (LEDs).

16. The light source of claim 14, wherein at least one of said solid state light sources is on said top surface.

17. The light source of claim 14, wherein said pedestal comprises a thermally conductive material.

18. The light source of claim 14, wherein said solid state light sources are electrically coupled in series.

19. The light source of claim 14, wherein said first side surfaces are adjacent said top surface, and said second side surfaces are adjacent said first side surfaces.

20. The light source of claim 19, wherein said solid state light sources are on at least some of said first side surfaces.

21. The light source of claim 19, wherein said solid state light sources are on every other one of said first side surfaces.

22. The light source of claim 14, comprising alternating first and second side surfaces.

23. The light source of claim 14, wherein said first and second side surfaces are adjacent said top surface and are alternating.

24. The light source of claim 23, wherein said solid state light sources are on at least some of said first side surfaces.

25. The light source of claim 14, wherein said top surface is approximately horizontal when said pedestal is vertical.

26. The lamp of claim 1, wherein said at least one side surface is adjacent said top surface.

27. The lamp of claim 1, wherein a surface adjacent said top surface has an angle equal to or greater than 90 degrees to said top surface.

28. The lamp of claim 1, wherein a surface adjacent said top surface has an angle greater than 90 degrees to said top surface.

29. The lamp of claim 1, wherein the thickness of said elongated pedestal reduces moving down from said top surface.

30. The lamp of claim 14, wherein said first side surfaces are adjacent said top surface.

31. The lamp of claim 14, wherein the thickness of said elongated pedestal reduces moving down from said top surface.

* * * * *